US009548709B2

(12) United States Patent  (10) Patent No.: US 9,548,709 B2
 Aparin (45) Date of Patent: Jan. 17, 2017

(54) INDEPENDENT GAIN CONTROL FOR MULTIPLE RECEIVE CIRCUITS CONCURRENTLY PROCESSING DIFFERENT TRANSMITTED SIGNALS

(71) Applicant: QUALCOMM Incorporated, San Diego, CA (US)

(72) Inventor: Vladimir Aparin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/720,864

(22) Filed: Dec. 19, 2012

(65) Prior Publication Data

US 2014/0170999 A1   Jun. 19, 2014

(51) Int. Cl.
 *H04B 7/08* (2006.01)
 *H03F 3/189* (2006.01)
 *H03G 3/00* (2006.01)
 *H03G 3/30* (2006.01)

(52) U.S. Cl.
 CPC .............. *H03G 3/00* (2013.01); *H03G 3/3078* (2013.01)

(58) Field of Classification Search
 CPC .............. H03F 3/68; H03F 3/189; H04B 1/16; H04B 1/18; H04B 7/08
 USPC ........ 455/232.1, 247.1, 132; 330/295, 124 R
 See application file for complete search history.

(56) References Cited

U.S. PATENT DOCUMENTS

| | | | |
|---|---|---|---|
| 5,179,730 A | 1/1993 | Loper | |
| 7,142,060 B1 * | 11/2006 | Maeda | ........................... 330/295 |
| 7,565,124 B2 | 7/2009 | Lee et al. | |
| 7,579,912 B2 * | 8/2009 | Fanous et al. | ................. 330/254 |
| 7,747,234 B2 | 6/2010 | Behzad | |
| 7,865,150 B2 | 1/2011 | McFarland et al. | |
| 8,095,094 B2 | 1/2012 | Matsui et al. | |
| 8,121,564 B2 * | 2/2012 | Behzad | ......................... 455/132 |
| 8,170,501 B2 | 5/2012 | Georgantas et al. | |

(Continued)

FOREIGN PATENT DOCUMENTS

GB    2491430 A    12/2012

OTHER PUBLICATIONS

Davis, et al., "A high-performance monolithic IF amplifier incorporating electronic gain control," IEEE J. Solid-State Circuits, vol. SC-3, No. 4, Dec. 1968, pp. 408-416.

(Continued)

*Primary Examiner* — Blane Jackson
(74) *Attorney, Agent, or Firm* — Rupit M. Patel

(57) ABSTRACT

Techniques for simultaneously receiving multiple transmitted signals with independent gain control are disclosed. In an exemplary design, an apparatus (e.g., a wireless device, an integrated circuit, etc.) includes a low noise amplifier (LNA) and first and second receive circuits. The LNA amplifies a receiver input signal and provides (i) a first amplified signal for a first set of at least one transmitted signal being received and (ii) a second amplified signal for a second set of at least one transmitted signal being received. The first receive circuit scales the first amplified signal based on a first adjustable gain selected for the first set of transmitted signal(s). The second receive circuit scales the second amplified signal based on a second adjustable gain selected for the second set of transmitted signal(s). The first and second adjustable gains may be independently selected, e.g., based on the received powers of the transmitted signals.

20 Claims, 11 Drawing Sheets

(56) References Cited

U.S. PATENT DOCUMENTS

| | | | |
|---|---|---|---|
| 8,222,956 B2* | 7/2012 | Hu et al. | 330/124 R |
| 8,467,750 B2* | 6/2013 | Chehrazi et al. | 455/127.2 |
| 2008/0139123 A1* | 6/2008 | Lee et al. | 455/63.1 |
| 2008/0231369 A1 | 9/2008 | Kim et al. | |
| 2010/0220636 A1 | 9/2010 | Chan | |
| 2012/0032743 A1* | 2/2012 | Hsieh et al. | 330/285 |

OTHER PUBLICATIONS

Fong, "Dual-band high-linearity variable-gain low-noise amplifier for wireless applications," IEEE Int. Solid-State Circuits Conf. (ISSCC) Dig. Tech. Papers, Feb. 1999, pp. 224-225.

Koutani, et al., "A Digitally Controlled Variable-Gain Low-Noise Amplifier With Strong Immunity to Interferers," http://ieeexplore.ieee.org/stamp/stamp.jsp?tp=&arnumber=4362100&userType=inst, IEEE Journal of Solid-State Circuits, vol. 42, No. 11, Nov. 2007, pp. 2395-2403.

Retz, et al., "A CMOS up-conversion receiver front-end for cable and terrestrial DTV application," IEEE Int. Solid-State Circuits Conf. (ISSCC) Dig. Tech. Papers, Feb. 2003, pp. 442-443.

Xiao J., et al., "A high dynamic range CMOS variable gain amplifier for mobile DTV tuner," IEEE J. Solid-State Circuits, vol. 42, No. 2, Feb. 2007, pp. 292-301.

International Search Report and Written Opinion—PCT/US2013/076747—ISA/EPO—Jul. 4, 2014.

\* cited by examiner

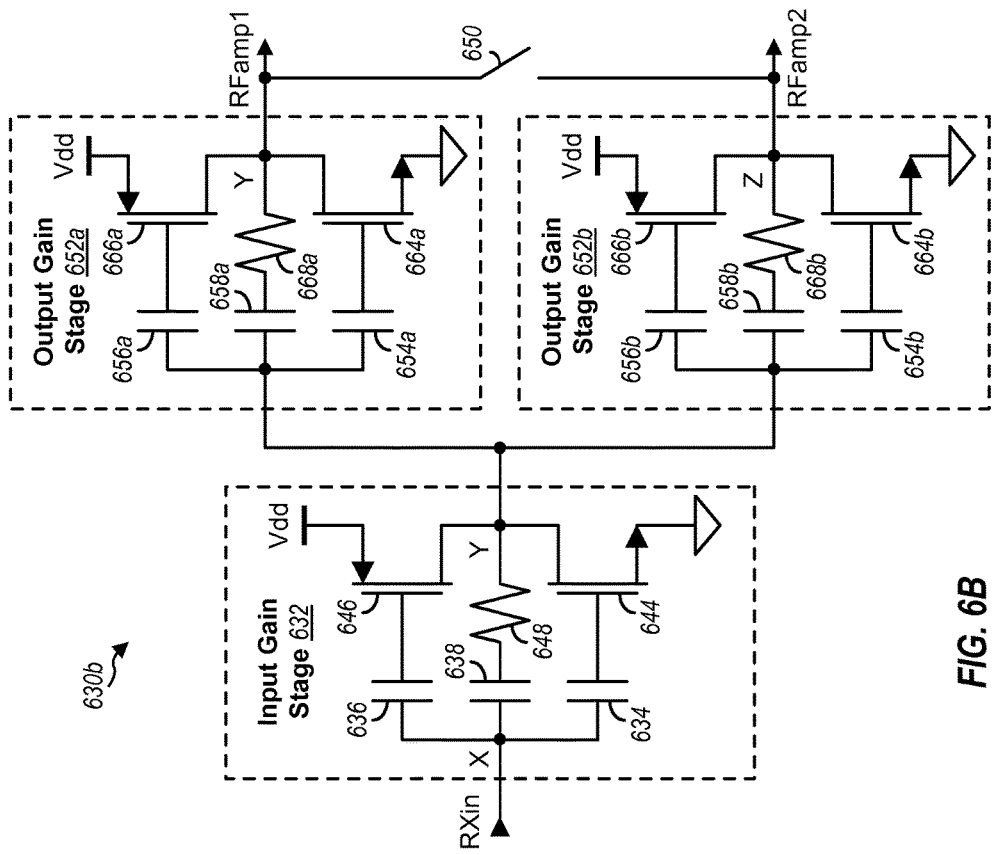
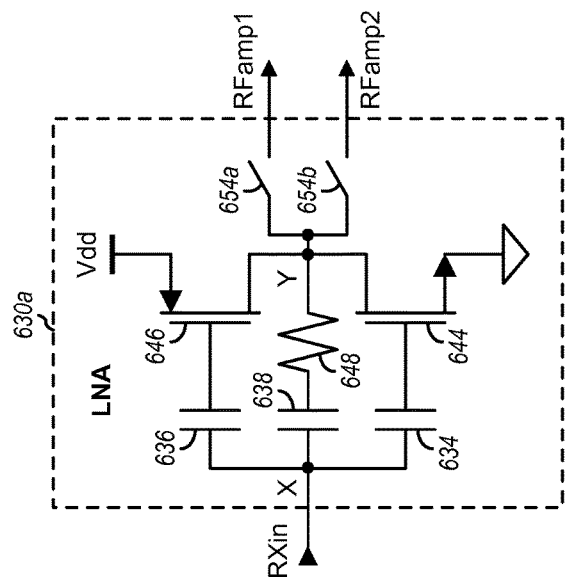
*FIG. 6B*
*FIG. 6A*

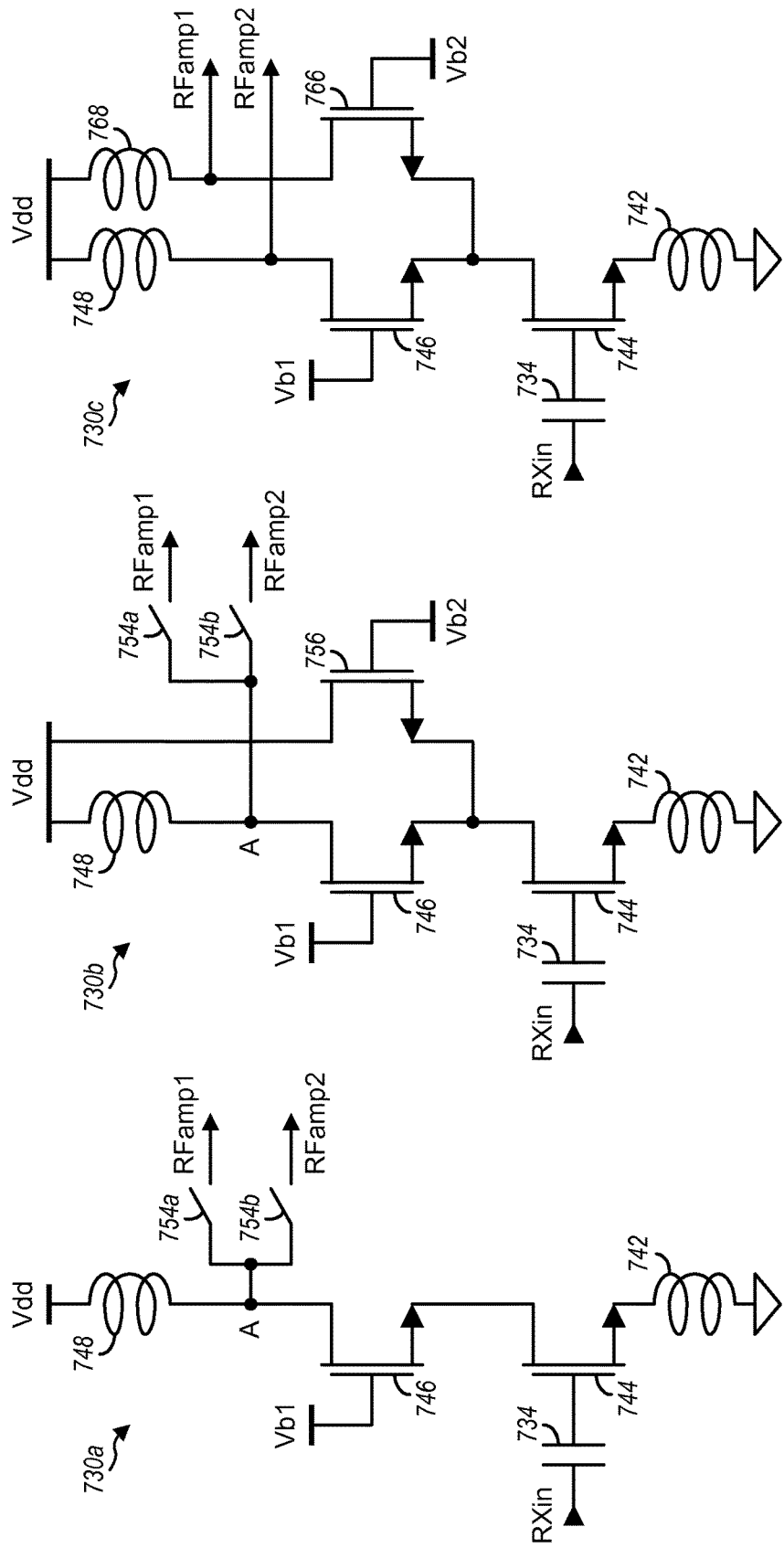

INDEPENDENT GAIN CONTROL FOR MULTIPLE RECEIVE CIRCUITS CONCURRENTLY PROCESSING DIFFERENT TRANSMITTED SIGNALS

BACKGROUND

I. Field

The present disclosure relates generally to electronics, and more specifically to receivers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper transmit power level, and transmit the output RF signal via an antenna to a base station. For data reception, the receiver may obtain a received RF signal via the antenna and may amplify and process the received RF signal to recover data sent by the base station.

A wireless device may simultaneously receive multiple transmitted signals. The transmitted signals may be sent on multiple carriers at different frequencies for carrier aggregation. The transmitted signals may travel via different propagation paths and may be received at different received power levels at the wireless device. It is desirable to simultaneously receive multiple transmitted signals with different received power levels such that good performance can be achieved for all transmitted signals.

BRIEF DESCRIPTION OF THE DRAWINGS

FIGS. 6A to 7C show five exemplary designs of an LNA.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for simultaneously receiving multiple transmitted signals with independent gain control for different transmitted signals are disclosed herein. These techniques may be used for various types of electronic devices such as wireless communication devices.

Figure 1:
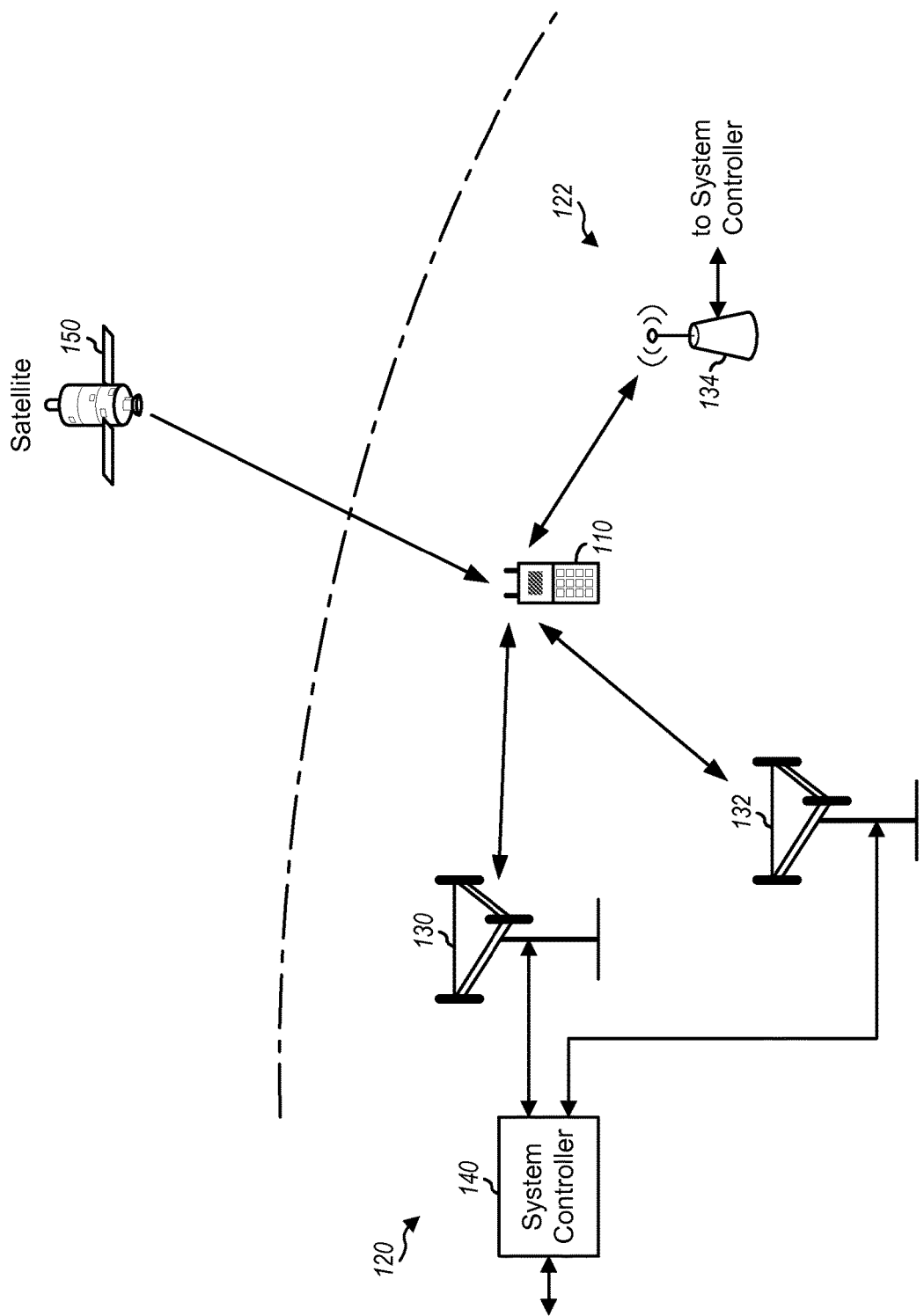
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Time Division Synchronous CDMA (TD-SCDMA), or some other version of CDMA. For simplicity, FIG. 1 shows wireless system 120 including three base stations 130, 132 and 134 and one system controller 140. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1×, TD-SCDMA, GSM, 802.11, etc.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system and/or control information describing operation on the carrier. A carrier may also be referred to as a component carrier (CC), a frequency channel, a cell, etc. A band may include one or more carriers. Each carrier may cover up to 20 MHz in LTE.

Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
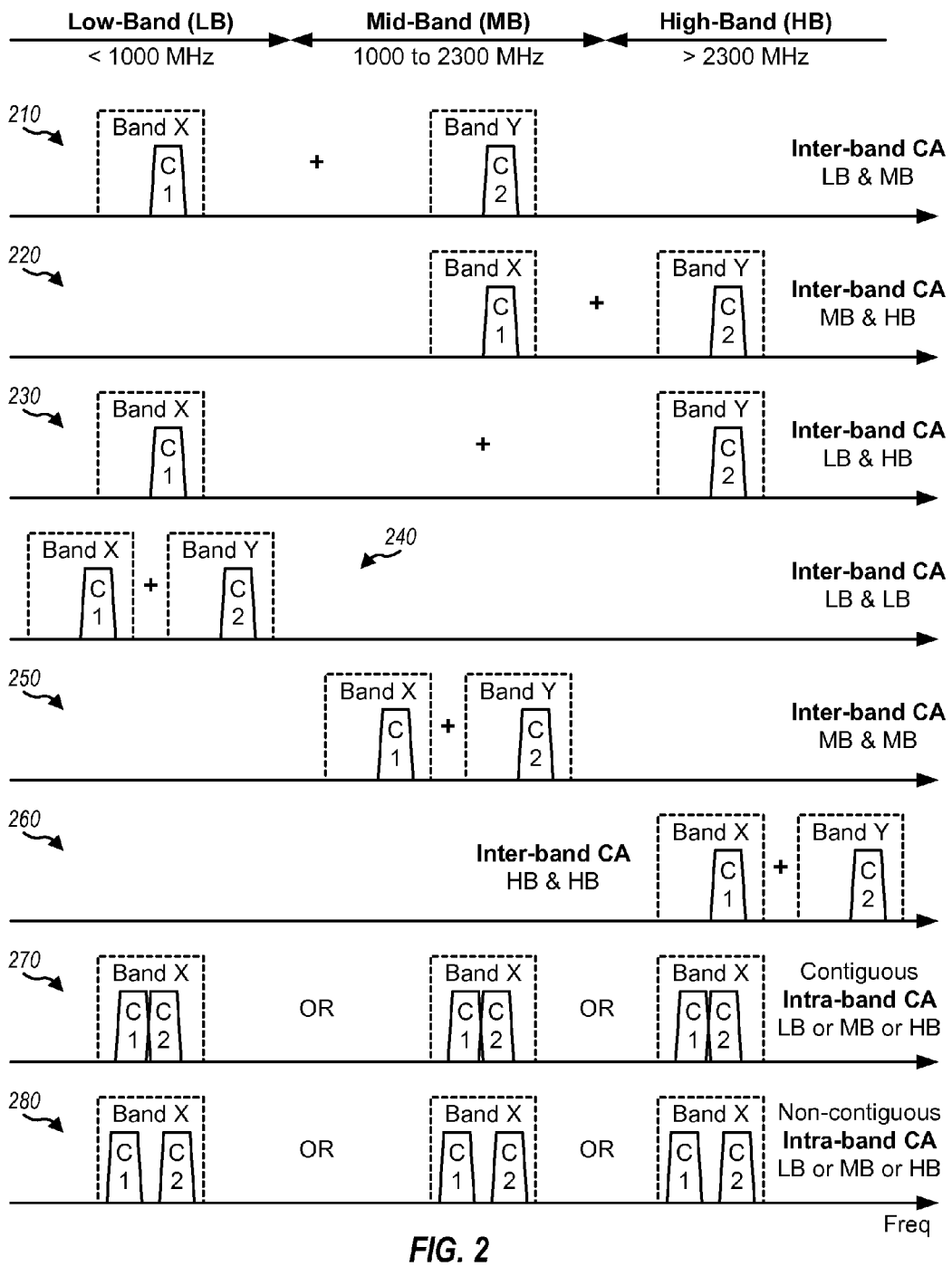
FIG. 2 shows various examples of carrier aggregation (CA).

FIG. 2 shows various CA scenarios that may be supported by wireless device 110. For simplicity, FIG. 2 shows wireless device 110 being configured with only one carrier in a band for inter-band CA. In general, wireless device 110 may be configured with one or more carriers in a given band.

Scenario 210 covers inter-band CA with one carrier C1 in band X in low-band and one carrier C2 in band Y in mid-band being configured for wireless device 110. Scenario 220 covers inter-band CA with one carrier C1 in band X in mid-band and one carrier C2 in band Y in high-band being configured for wireless device 110. Scenario 230 covers inter-band CA with one carrier C1 in band X in low-band and one carrier C2 in band Y in high-band being configured for wireless device 110.

Scenario 240 covers inter-band CA with one carrier C1 in band X in low-band and one carrier C2 in band Y also in low-band being configured for wireless device 110. Scenario 250 covers inter-band CA with one carrier C1 in band X in mid-band and one carrier C2 in band Y also in mid-band being configured for wireless device 110. Scenario 260 covers inter-band CA with one carrier C1 in band X in high-band and one carrier C2 in band Y also in high-band being configured for wireless device 110.

Scenario 270 covers contiguous intra-band CA with two adjacent carriers C1 and C2 in band X in low-band, or mid-band, or high-band being configured for wireless device 110. Scenario 280 covers non-contiguous intra-band CA with two non-adjacent carriers C1 and C2 in band X in low-band, or mid-band, or high-band being configured for wireless device 110.

FIG. 2 shows some examples of carrier aggregation. Carrier aggregation may also be supported for other combinations of bands and band groups.

Figure 3:
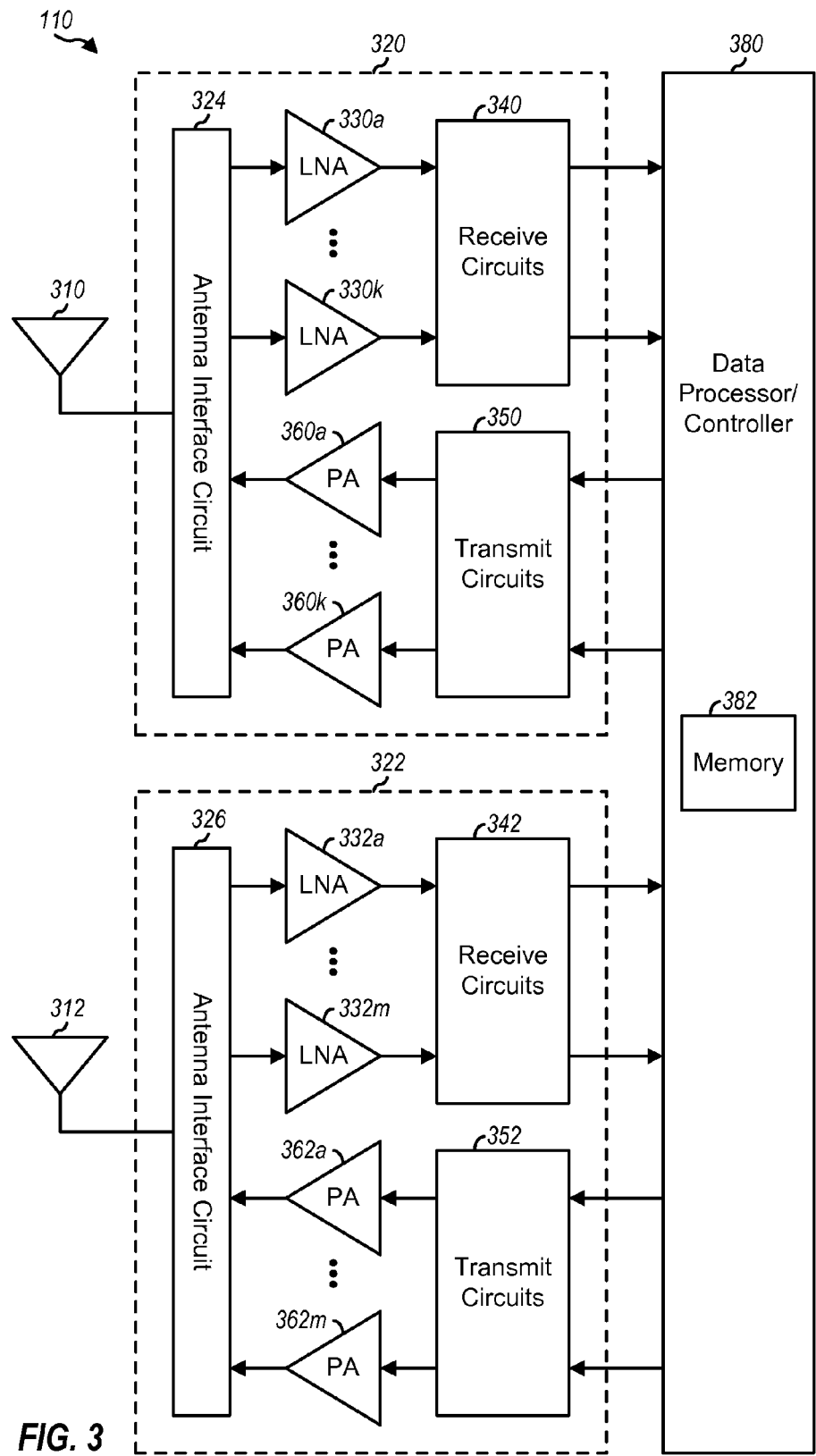
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes an antenna interface circuit 324, multiple (K) LNAs 330a to 330k, receive circuits 340, transmit circuits 350, and K power amplifiers (PAs) 360a to 360k. Transceiver 322 includes an antenna interface circuit 326, multiple (M) LNAs 332a to 332m, receive circuits 342, transmit circuits 352, and M PAs 362a to 362m. Transceivers 320 and 322 may support multiple frequency bands, carrier aggregation, multiple radio technologies, receive diversity, multiple-input multiple-output (MIMO) transmission from multiple transmit antennas to multiple receive antennas, etc.

For data reception, antenna 310 receives signals from base stations and/or other transmitter stations and provides a received RF signal, which is routed through antenna interface circuit 324 and provided as a receiver input signal to a selected LNA 330. Antenna interface circuit 324 may include switches, duplexers, transmit filters, receive filters, matching circuits, etc. The selected LNA 330 amplifies the receiver input signal and provides one or more amplified signals to receive circuits 340. Receive circuits 340 scale (e.g., amplify and/or attenuate) each amplified signal, downconvert each scaled signal from RF to baseband, filter and amplify each downconverted signal, and provide one or more analog input signals to data processor 380. Receive circuits 340 may include mixers, filters, amplifiers, matching circuits, oscillators, local oscillator (LO) generators, phase locked loops (PLLs), etc.

For data transmission, data processor 380 processes (e.g., encodes and modulates) data to be transmitted and provides one or more analog output signals to transmit circuits 350. Transmit circuits 350 amplify, filter, and upconvert each analog output signal from baseband to RF and provide a modulated signal to a selected PA 360. Transmit circuits 350 may include amplifiers, filters, mixers, matching circuits, oscillators, LO generators, PLLs, etc. The selected PA 360 amplifies the modulated signal and provides an output RF signal having the proper transmit power level. The output RF signal is routed through antenna interface circuit 324 and transmitted via antenna 310.

LNAs 332, receive circuits 342, transmit circuits 352, and PAs 362 within transceiver 322 may operate in similar manner as LNAs 330, receive circuits 340, transmit circuits 350, and PAs 360 within transceiver 320. Transceivers 320 and 322 may also include other circuits not shown in FIG. 3. All or a portion of transceivers 320 and 322 may be implemented on one or more analog integrated circuits (ICs), RF ICs (RFICs), mixed-signal ICs, etc. For example, LNAs 330 and receive circuits 340 may be implemented on one module, which may be an RFIC, etc. The circuits in transceivers 320 and 322 may also be implemented in other manners.

Data processor/controller 380 may perform various functions for wireless device 110. For example, data processor 380 may perform processing for data being received via receiver circuits 340 and 342 and data being transmitted via transmit circuits 350 and 352. Controller 380 may control the operation of various circuits within transceivers 320 and 322. A memory 382 may store program codes and data for data processor/controller 380. Data processor/controller 380 may be implemented on one or more application specific integrated circuits (ASICs) and/or other ICs.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. In any case, the multiple transmitted signals may be sent at the same or different transmit power levels. Each transmitted signal may travel via a particular propagation path and may be received at a particular received power level at wireless device 110. The multiple transmitted signals may travel via different propagation paths, which may result in fading of one transmitted signal relative to another transmitted signal even if all transmitted signals were sent from the same base station/transmit antenna. The fading may be as large as 20 decibels (dB).

Figure 4:
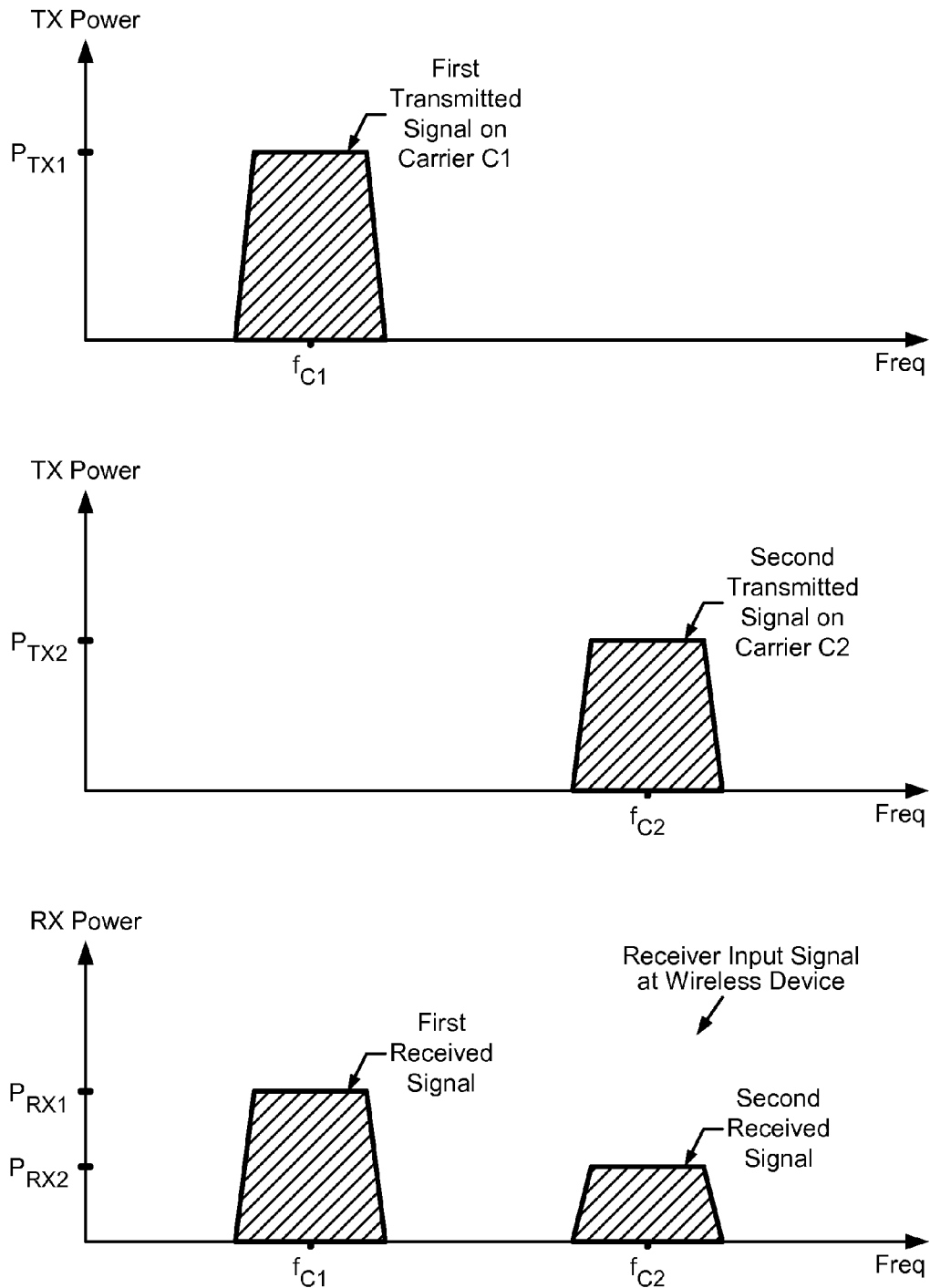
FIG. 4 shows transmission and reception of multiple transmitted signals.

FIG. 4 shows exemplary transmission and reception of multiple transmitted signals. A first transmitted signal may be sent on a first carrier C1 at a first transmit power level of $P_{TX1}$. A second transmitted signal may be sent on a second carrier C2 at a second transmit power level of $P_{TX2}$, which may or may not match the first transmit power level. Carriers C1 and C2 may be adjacent to each other in frequency or may be separate from each other. The first and second transmitted signals may be sent by a single base station to wireless device 110 for carrier aggregation. Alternatively, the first and second transmitted signals may be sent by different base stations to wireless device 110 for carrier aggregation, CoMP, etc.

Antenna 310 at wireless device 110 may receive multiple transmitted signals and may provide a receiver input signal comprising one or more received signals for each transmitted signal. Each received signal may correspond to a version of a transmitted signal received via a particular propagation/signal path. The antenna may receive a given transmitted signal via multiple propagation paths, which may be associated with different complex channel gains and delays. The receiver input signal may then include multiple received signals corresponding to different versions of the transmitted signal received via different propagation paths. The characteristics (e.g., received power, delay, center frequency, etc.) of each received signal may be dependent on the characteristics (e.g., transmit power, center frequency, etc.) of the corresponding transmitted signal as well as the characteristics (e.g., channel gain, delay, etc.) of the associated propagation path. For simplicity, the description below assumes that one received signal is obtained for each transmitted signal via one propagation path.

Wireless device 110 may receive the first and second transmitted signals at its antenna 310 and may obtain a receiver input signal from antenna 310. The receiver input signal may include a first received signal for the first transmitted signal and a second received signal for the second transmitted signal. The first received signal may have a received power level of $P_{RX1}$, which may be dependent on the channel gain of a first propagation path traveled by the first transmitted signal to reach wireless device 110. The second received signal may have a received power level of $P_{RX2}$, which may be dependent on the channel gain of a second propagation path traveled by the second transmitted signal to reach wireless device 110. In general, different transmitted signals may be received at different power levels at wireless device 110 due to fading and/or other phenomena. Fading refers to a phenomenon in which signal components at certain frequencies add destructively at a receiver. If fading is severe, then the receiver input signal may include (i) a strong received signal for a transmitted signal with a small pathloss (or a large channel gain) and (ii) a weak received signal for a transmitted signal with a large pathloss (or a small channel gain).

Wireless device 110 may use the same receiver gain for all received signals, e.g., for both a strong received signal and a weak received signal. If a high gain is used, then some circuit blocks (e.g., baseband filters, analog-to-digital converters (ADCs), etc.) in the receiver may saturate or clip either due to the strong received signal itself or due to its adjacent channel interference (ACI). The saturation may result in intermodulation distortion (IMD) that may degrade performance. Conversely, if a low gain is used, then low sensitivity may be obtained for the weak received signal, and performance may be poor for the weak received signal.

In an aspect of the present disclosure, wireless device 110 may simultaneously process multiple transmitted signals using separate/individual gain control for different transmitted signals. Wireless device 110 may perform gain control separately for each set of at least one transmitted signal being received and processed via a separate receive circuit at wireless device 110. This may enable wireless device 110 to use a low gain for a strong received signal and a high gain for a weak received signal, which may avoid the problems related to saturation and low sensitivity described above. Separate gain control for different transmitted signals may be implemented in various manners.

Figure 5A:
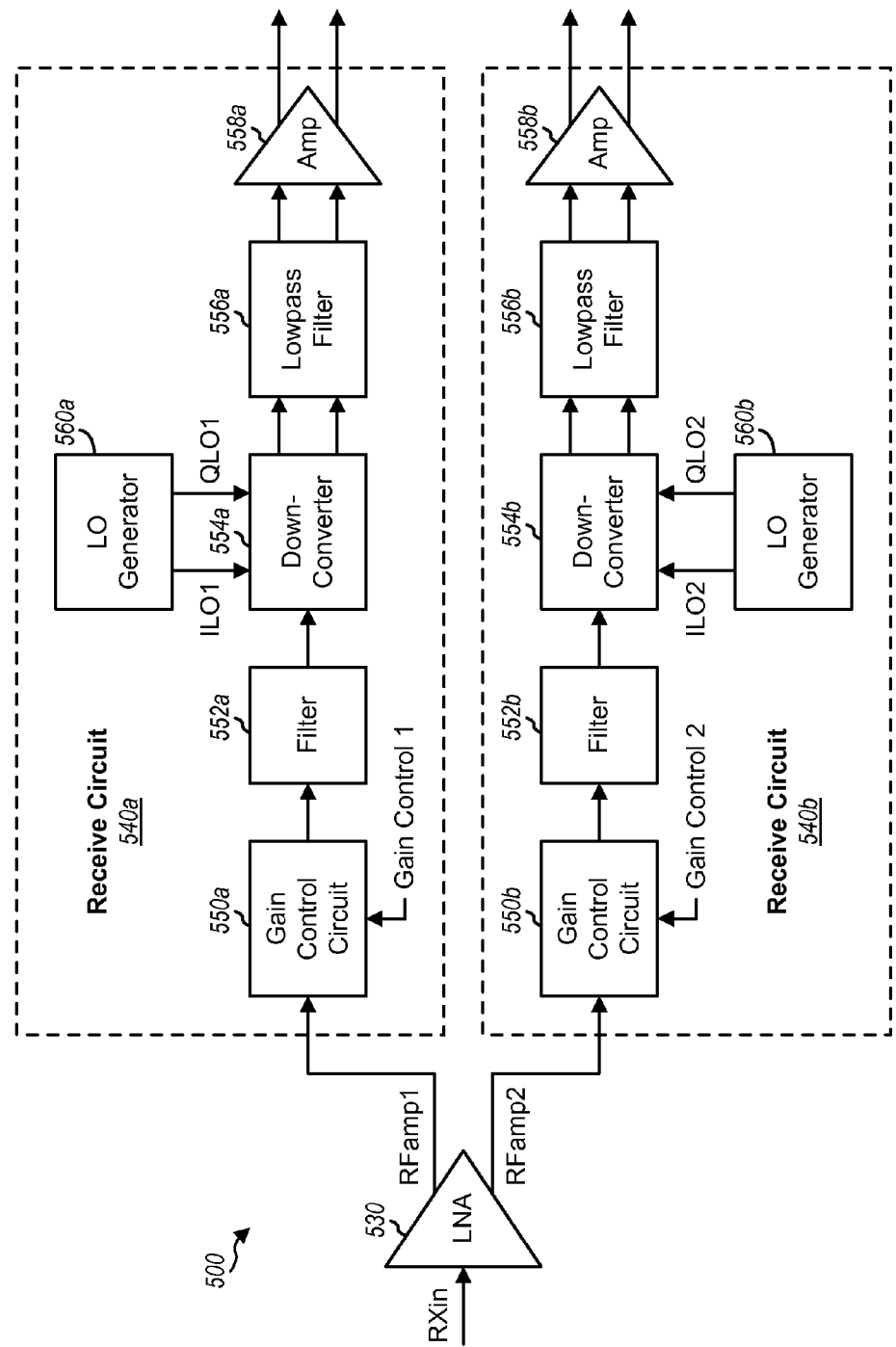
FIGS. 5A and 5B show two exemplary designs of a receiver with separate gain control for multiple transmitted signals being received simultaneously.

FIG. 5A shows a block diagram of an exemplary design of a receiver 500 with separate gain control for different transmitted signals being received. In the exemplary design shown in FIG. 5A, receiver 500 includes a single-input multiple-output (SIMO) LNA 530 and receive circuits 540a and 540b. Each receive circuit 540 may also be referred to as a receive path, etc. Receiver 500 may be part of transceiver 320 or 322 within wireless device 110 in FIG. 3. LNA 530 may correspond to one of LNAs 330 or 332 in FIG. 3. Receive circuits 540a and 540b may be part of receive circuit 340 and/or 342 in FIG. 3.

In the exemplary design shown in FIG. 5A, LNA 530 has an input receiving a receiver input signal (RXin), a first output coupled to receive circuit 540a, and a second output coupled to receive circuit 540b. LNA 530 may amplify the receiver input signal and provide a first amplified signal (RFamp1) to receive circuit 540a and/or a second amplified signal (RFamp2) to receive circuit 540b. In another exemplary design that is not shown in FIG. 5A, LNA 530 may include one output coupled to both receive circuits 540a and 540b.

Each receive circuit 540 may receive the amplified signal from LNA 530 and provide an input baseband signal to a data processor (e.g., data processor 380 in FIG. 3). Within receive circuit 540a, a gain control circuit 550a may receive the amplified signal from LNA 530 and may scale the amplified signal based on a gain selected for at least one transmitted signal being received by receive circuit 540a. A filter 552a may filtered a scaled signal from gain control circuit 550a and provide a filtered signal to a downconverter 554a. Filter 552a may comprise a single-ended to differential converter and may also be referred to as an interface circuit. Downconverter 554a may also receive a first inphase (I) LO signal (ILO1) and a first quadrature (Q) LO signal (QLO1) from an LO generator 560a, downconvert the filtered signal with the ILO1 and QLO1 signal, and provide I and Q downconverted signals. The frequency of the ILO1 and QLO1 signals may be selected based on the center frequency of each transmitted signal being received by receive circuit 540a. For example, if one transmitted signal is being received, then the frequency of the ILO1 and QLO1 signals may be equal to the center frequency of the transmitted signal being received. A lowpass filter 556a may filter the I and Q downconverted signals to remove undesirable signal components resulting from frequency downconversion and may provide I and Q filtered signals. Lowpass filter 556a may have a bandwidth that may be determined based on the bandwidth of each transmitted signal being received by receive circuit 540a. In an exemplary design, lowpass filter 556a may have a configurable bandwidth, which may be set based on the bandwidth of at least one transmitted signal being received. An amplifier (Amp) 558a may amplify the I and Q filtered signals and provide I and Q input baseband signals. The I and Q input baseband signals may be digitized by ADCs within the data processor and may be digitally processed (e.g., demodulated and decoded) to recover data sent to wireless device 110.

Receive circuit 540b may include a gain control circuit 550b, a filter 552b, a downconverter 554b, a lowpass filter 556b, an amplifier 558b, and an LO generator 560b, which may operate in similar manner as the corresponding circuits in receive circuit 540a.

FIG. 5A shows an exemplary design of receive circuits 540a and 540b. In general, the conditioning of the signals in a receive circuit may be performed by one or more stages of amplifier, filter, mixer, etc. These circuits may be arranged differently from the configuration shown in FIG. 5A. For example, filter 552 may be located after gain control circuit 550 as shown in FIG. 5A, or may be located before gain control circuit 550, or may be omitted. Furthermore, other circuits not shown in FIG. 5A may be used in a receive circuit. For example, matching circuits may be used to match various circuits in FIG. 5A. Some circuits in FIG. 5A may also be omitted. A receiver may also include more than two receive circuits to simultaneously process more than two transmitted signals.

Receiver 500 may operate in one of multiple operating modes. In a first operating mode, which may be selected when carrier aggregation is not configured for wireless device 110, LNA 530 may amplify the receiver input signal and provide one amplified signal to one receive circuit 540a or 540b. In a second operating mode, which may be selected when carrier aggregation is configured for wireless device 110, LNA 530 may amplify the receiver input signal and provide two amplified signals to two receive circuits 540a and 540b. In one exemplary design, LNA 530 has a fixed gain, which may be selected to provide good performance for a range of received power levels. In another exemplary design, LNA 530 may have a variable gain, which may be common for all transmitted signals being received by receiver 500 and may be selected to provide good performance.

One receive circuit 540a or 540b may be enabled to process a single transmitted signal being received by wireless device 110. Alternatively, both receive circuits 540a and 540b may be enabled to process two transmitted signals (or two sets of transmitted signals) being received simultaneously by wireless device 110. Each receive circuit 540 may be used to receive one or more transmitted signals.

Gain control circuit 550 in each receive circuit 540 may be separately/individually controlled to provide a desired gain for the transmitted signal(s) being received via that receive circuit 540. Gain control circuits 550a and 550b may apply the same gain or different gains for their transmitted signals. Gain control circuit 550 may be a passive circuit, or an active circuit, or may be part of LNA 530.

Filters 552a and 552b may have different bandwidths and/or different center frequencies, which may be selected based on the bandwidths and/or the center frequencies of the transmitted signals being received.

Each receive circuit 540 may include a different LO generator 560, which may provide an LO signal at a suitable frequency for downconverter 554. LO generators 560a and 560b may generate their LO signals at different frequencies, which may be dependent on the center frequencies of the transmitted signals being received.

An amplified signal provided by LNA 530 to each receive circuit 540 may include received signals for all transmitted signals reaching wireless device 110. Gain control circuit 550 in each receive circuit 540 may scale its amplified signal by a selected gain, which may then scale all received signals in the amplified signal by the same amount. However, downconverter 554 in each receive circuit 540 may perform downconversion for a selected transmitted signal. For example, receive circuit 540a may be used to recover a first transmitted signal at a first carrier frequency. Gain control circuit 550a may apply a first gain that may be selected based on a first received signal corresponding to the first transmitted signal being received. The frequency of a first LO signal provided to downconverter 554a may be set based on the first carrier frequency of the first transmitted signal. Lowpass filter 556a may pass the first received signal and may attenuate other received signals.

Similarly, receive circuit 540b may be used to recover a second transmitted signal at a second carrier frequency. Gain control circuit 550b may apply a second gain that may be selected based on a second received signal corresponding to the second transmitted signal being received. Gain control circuits 550a and 550b may apply different gains due to different received power levels of the first and second received signals. The frequency of a second LO signal provided to downconverter 554b may be set based on the second carrier frequency of the second transmitted signal. Different LO frequencies may be used for downconverters 554a and 554b to allow for downconversion of received signals at different carrier frequencies. Lowpass filter 556b may pass the second received signal and may attenuate all other received signals. Lowpass filters 556a and 556b may have the same bandwidth or different bandwidths, which may be dependent on the bandwidths of the transmitted signals being received.

Figure 5B:
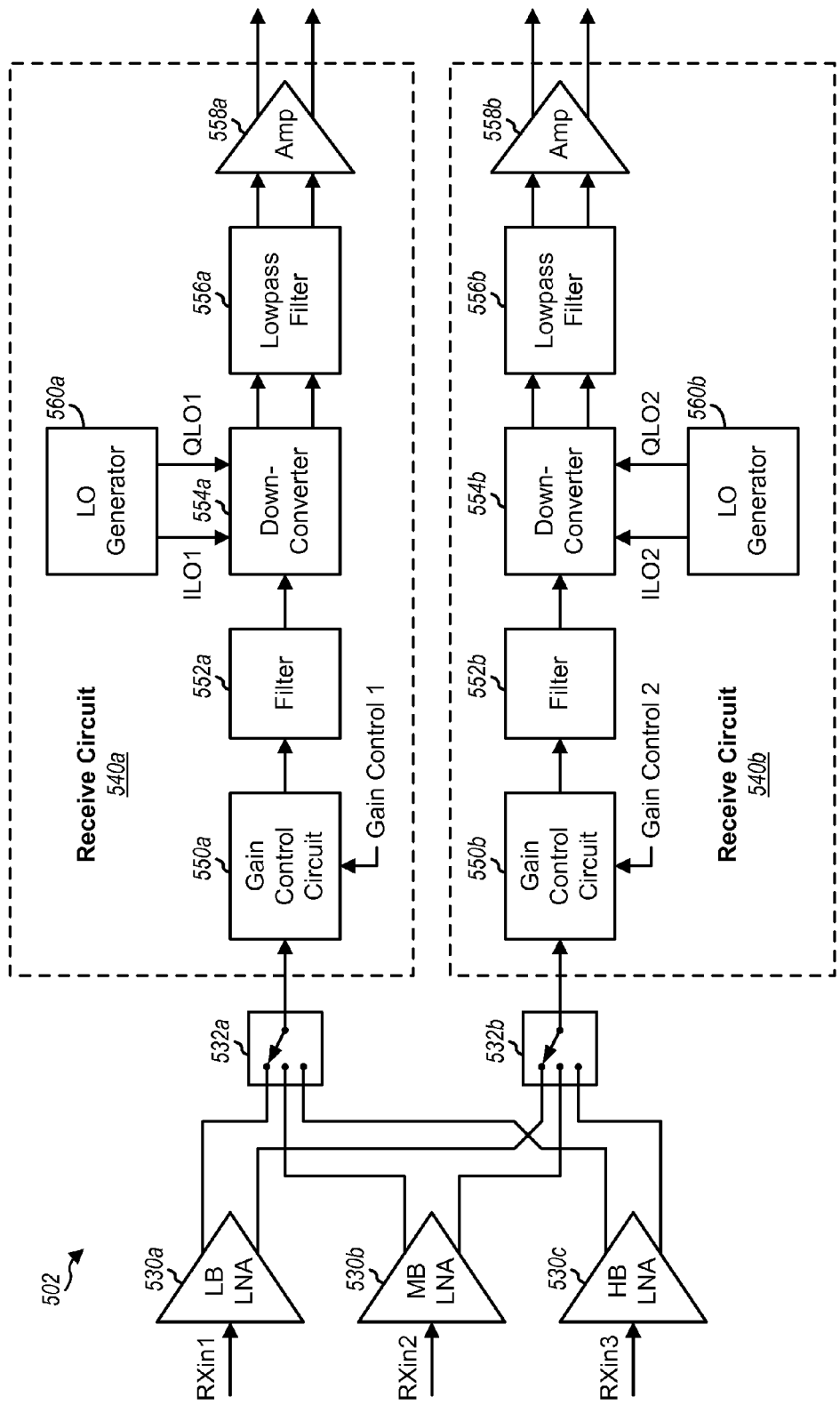

FIG. 5B shows a block diagram of an exemplary design of a receiver 502 with separate gain control for different transmitted signals being received. In the exemplary design shown in FIG. 5B, receiver 502 includes three SIMO LNAs 530a, 530b and 530c for low-band, mid-band, and high-band, respectively, and receive circuits 540a and 540b. Receiver 502 may be part of transceiver 320 or 322 in FIG. 3. LNAs 530a, 530b and 530c may correspond to three of LNAs 330 or 332 in FIG. 3. LNAs 530a, 530b and 530c may have their inputs coupled to an antenna interface circuit for one antenna, e.g., to antenna interface circuit 324 for antenna 310 in FIG. 3.

In the exemplary design shown in FIG. 5B, LNA 530a has an input receiving a first receiver input signal (RXin1), a first output coupled to a first input of a switch 532a, and a second output coupled to a first input of a switch 532b. LNA 530b has an input receiving a second receiver input signal (RXin2), a first output coupled to a second input of switch 532a, and a second output coupled to a second input of switch 532b. LNA 530c has an input receiving a third receiver input signal (RXin3), a first output coupled to a third input of switch 532a, and a second output coupled to a third input of switch 532b. Switch 532a has its output coupled to receive circuit 540a, and switch 532b has its output coupled to receive circuit 540b. Switch 532a may be controlled to couple the first output of LNA 530a, 530b, or 530c to receive circuit 540a. Similarly, switch 532b may be controlled to couple the second output of LNA 530a, 530b, or 530c to receive circuit 540b.

Receiver 502 may operate in one of multiple operating modes. In a first operating mode, which may be selected when carrier aggregation is not configured for wireless device 110, one of LNAs 530a, 530b and 530c for a band group of interest may be selected to amplify its receiver input signal and provide one amplified signal to one receive circuit 540a or 540b. In a second operating mode, which may be selected when intra-band CA is configured for wireless device 110, one LNA 530 for one band group of interest may be selected to amplify its receiver input signal and provide two amplified signals to two receive circuits 540a and 540b. Alternatively, when inter-band CA is configured for wireless device 110, two LNAs 530 for two band groups of interest may be selected to amplify their receiver input signals and provide two amplified signals to two receive circuits 540a and 540b. Each LNA 530 may have a fixed gain or a variable gain, which may be selected to provide good performance.

LNAs may be implemented with various circuit designs. Some exemplary LNA designs are described below. LNAs may also be implemented with transistors of various types. Some exemplary designs of LNAs implemented with N-channel metal oxide semiconductor (NMOS) transistors and P-channel metal oxide semiconductor (PMOS) transistor are described below.

FIG. 6A shows a schematic diagram of an exemplary design of a SIMO LNA 630a having an inverter topology. LNA 630a may be used for any of LNAs 330 and 332 in FIG. 3 and any of LNAs 530 in FIGS. 5A and 5B. Within LNA 630a, an NMOS transistor 644 has its source coupled to circuit ground, its gate coupled to one end of an AC coupling capacitor 634, and its drain coupled to node Y. A PMOS transistor 646 has its source coupled to a power supply (Vdd), its gate coupled to one end of an AC coupling capacitor 636, and its drain coupled to node Y. The other ends of capacitors 634 and 636 are coupled to node X, which is the input of LNA 630a. A resistor 648 and a capacitor 638 are coupled in series, and the combination is coupled between node X and node Y. A switch 654a is coupled between node Y and a first output of LNA 630a. A switch 654b is coupled between node Y and a second output of LNA 630a.

In the exemplary design shown in FIG. 6A, MOS transistors 644 and 646 form an amplifier having relatively high gain and low power consumption. Resistor 648 provides feedback between the output and input of LNA 630a. The feedback enables LNA 630a to achieve good linearity and good performance for input second-order intercept point (IIP2) and input third-order intercept point (IIP3). Inverter-type LNAs may have higher IIP2 as compared to other types of LNAs. The higher IIP2 of inverter-type LNAs may be beneficial in multi-carrier systems.

LNA 630a may be enabled by applying appropriate bias voltages to the gates of NMOS transistor 644 and PMOS transistor 646. When enabled, LNA 630a receives and amplifies a receiver input signal (RXin) and provides an amplified signal. Switch 654a may be closed and may then provide the amplified signal to a first receive circuit (e.g., receive circuit 540a in FIG. 5A or 5B). Alternatively or additionally, switch 654b may be closed and may then provide the amplified signal to a second receive circuit (e.g., receive circuit 540b in FIG. 5A or 5B). When enabled, LNA 630a may thus provide the first amplified signal via switch 654a and/or the second amplified signal via switch 654b. LNA 630a may be disabled by applying a low bias voltage to the gate of NMOS transistor 644 and a high bias voltage to the gate of PMOS transistor 646.

FIG. 6B shows a schematic diagram of an exemplary design of a SIMO LNA 630b comprising multiple gain stages having an inverter structure. LNA 630b may also be used for any of the LNAs in FIGS. 3, 5A and 5B. LNA 630b includes an input gain stage 632 and two output gain stages 652a and 652b. Input gain stage 632 has its input coupled to node X, which is an input of LNA 630b, and its output coupled to the inputs of output gain stages 652a and 652b. Output gain stage 652a has its output coupled to node Y, which is a first output of LNA 630b. Output gain stage 652b has its output coupled to node Z, which is a second output of LNA 630b. A switch 650 is coupled between the outputs of output gain stages 652a and 652b.

Input gain stage 632 includes NMOS transistor 644, PMOS transistor 646, resistor 648, and capacitors 634, 636 and 638, which are coupled as described above for FIG. 6A. Each output gain stage 652 includes an NMOS transistor 664, a PMOS transistor 666, a resistor 668, and capacitors 654, 656 and 658, which are coupled in similar manner as NMOS transistor 644, PMOS transistor 646, resistor 648, and capacitors 634, 636 and 638, respectively, in FIG. 6A.

Input gain stage 632, output gain stage 652a, and output gain stage 652b may each be enabled or disabled by applying appropriate bias voltages to the gates of the MOS transistors within these gain stages. When enabled, input gain stage 632 may receive and amplify a receiver input signal and provides an intermediate signal to output gain stages 652a and 652b. When enabled, output gain stage 652a may receive and amplify the intermediate signal and provide the first amplified signal to a first receive circuit. When enabled, output gain stage 652b may receive and amplify the intermediate signal and provide the second amplified signal to a second receive circuit.

In the exemplary design shown in FIG. 6B, switch 650 is used to perform noise splitting between the two LNA outputs. Noise splitting refers to "splitting" of noise among multiple outputs such that each output observes less noise and can achieve a better/lower noise figure. When switch 650 is opened, the output current provided by each output gain stage 652 may be expressed as:

$$i_m = i_{s,m} + i_{n,m}, \text{ for } m=1,2 \qquad \text{Eq (1)}$$

where
$i_{s,m}$ is a signal current from the m-th output gain stage,
$i_{n,m}$ is a noise current from the m-th output gain stage, and
$i_m$ is an output current from the m-th output gain stage.

When switch 650 is closed, the outputs of output gain stages 652a and 652b are shorted together at a summing node, which corresponds to nodes Y and Z. In this case, the total current $i_{total}$ at the summing node may be expressed as:

$$i_{total} = (i_{s,1} + i_{n,1}) + (i_{s,2} + i_{n,2}) \approx 2 * i_s + (i_{n,1} + i_{n,2}) \qquad \text{Eq (2)}$$

where $i_s$ is an average signal current from each output gain stage 652, and
$i_{total}$ is a total current from both output gain stages 652a and 652b.

The signal currents $i_{s,1}$ and $i_{s,2}$ from output gain stages 652a and 652b should be similar since they are generated based on the same intermediate signal from input gain stage 632. Hence, the total signal current may be approximately equal to $2*i_s$. The noise currents $i_{n,1}$ and $i_{n,2}$ from output gain stages 652a and 652b should be uncorrelated. Hence, the total noise current is equal to the sum of the noise currents from output gain stages 652a and 652b.

The total current at the summing node may be split and provided to the two outputs of LNA 630b. The output current at each LNA output may be expressed as:

$$i_{out} = \frac{i_{total}}{2} \approx i_s + \frac{i_{n,1} + i_{n,2}}{2}, \qquad \text{Eq (3)}$$

where $i_{out}$ is an output current provided at each LNA output.

The noise currents from output gain stages 652a to 652b should be uncorrelated. Hence, the noise power at each LNA output may be reduced by a factor of $\sqrt{2}$. The signal power from each LNA output may be approximately the same, regardless of whether or not the two LNA outputs are shorted together, due to the signal currents from output gain stages 652a to 652b being similar or highly correlated. The noise figure at each LNA output may be improved with noise splitting since the signal power is approximately the same whereas the noise power is reduced by a factor of $\sqrt{2}$ with noise splitting.

FIG. 6A shows a single-stage LNA 630a and FIG. 6B shows a two-stage LNA 630b. In general, an LNA may include any number of gain stages, which may be selected based on the desired overall gain of the LNA. An LNA may also include any number of output gain stages to drive any number of receive circuits. All or a subset of the LNA outputs may be active at any given moment to drive their associated receive circuits. The active LNA outputs may be coupled/shorted together to perform noise splitting and improve noise figure.

LNA 630a in FIG. 6A and LNA 630b in FIG. 6B may each have a fixed gain, which may be determined based on the transconductances of the NMOS transistors and PMOS transistors. The transconductances of the MOS transistors may, in turn, be dependent on the sizes of the MOS transistors, the bias current, the bias voltages, the feedback resistor (if any), etc. LNA 630a and/or LNA 630b may also have a variable gain, which may be obtained by changing the sizes of the MOS transistors, the bias current, the bias voltages, etc. The sizes of the MOS transistors may be changed by connecting multiple MOS transistors in parallel and enabling/turning ON different combinations of MOS transistors to obtain different gains.

FIG. 7A shows a schematic diagram of an exemplary design of a common-source SIMO LNA 730a with source degeneration inductor. LNA 730a may be used for any of the LNAs in FIGS. 3, 5A and 5B. Within LNA 730a, a gain NMOS transistor 744 has its source coupled to one end of a source degeneration inductor 742 and its gate coupled to one end of an AC coupling capacitor 734. The other end of inductor 742 is coupled to circuit ground. The other end of capacitor 734 is coupled to an input of LNA 730a. A cascode NMOS transistor 746 has its source coupled to the drain of NMOS transistor 744, its gate receiving a bias voltage (Vb1), and its drain coupled to node A. A load inductor 748 is coupled between a power supply and node A. A switch 754a is coupled between node A and a first output of LNA 730a. A switch 754b is coupled between node A and a second output of LNA 730a.

In LNA 730a, gain NMOS transistor 744 receives and amplifies a receiver input signal. Cascode NMOS transistor 746 buffers an output signal from gain NMOS transistor 744 and provides an amplified signal to one or two receive circuits. Inductor 742 may improve the linearity of LNA 730a and may also help with input matching for LNA 730a.

FIG. 7B shows a schematic diagram of an exemplary design of a SIMO LNA 730b with cascode current steering. LNA 730b may also be used for any of the LNAs in FIGS. 3, 5A and 5B. LNA 730b includes all of the circuit components in LNA 730a in FIG. 7A. LNA 730b further includes an NMOS transistor 756 having its source coupled to the drain of gain NMOS transistor 744, its gate receiving a control voltage (Vb2), and its drain coupled to the power supply. NMOS transistor 756 may operate as a current steering switch that may be controlled to provide variable gain for LNA 730b. NMOS transistor 756 may be turned OFF in order to pass all of the current from gain NMOS transistor 744 to cascode NMOS transistor 746, which may then provide a high gain for LNA 730b. Conversely, NMOS transistor 756 may be turned ON in order to steer some of the current from gain NMOS transistor 744 to the power supply, which may then result in a lower gain for LNA 730b. The gain of LNA 730b may be adjusted by (i) controlling the bias voltage applied to the gate of NMOS transistor 756, (ii) changing the size of NMOS transistor 756 (e.g., by turning on more NMOS transistors coupled in parallel), or (iii) varying other characteristics of NMOS transistor 756.

FIG. 7C shows a schematic diagram of an exemplary design of a SIMO LNA 730c with a current steering cascode switch. LNA 730c may also be used for any of the LNAs in FIGS. 3, 5A and 5B. LNA 730c includes all of the circuit components in LNA 730a in FIG. 7A, except for switches 754a and 754b. LNA 730c further includes an NMOS transistor 766 and an inductor 768. NMOS transistor 766 has its source coupled to the drain of gain NMOS transistor 744, its gate receiving a control voltage (Vb2), and its drain coupled to one end of inductor 768. The other end of inductor 768 is coupled to the Vdd supply. NMOS transistors 746 and 766 provide the RFamp1 and RFamp2 signals, respectively, at their drains. NMOS transistors 746 and 766 form a current steering cascode switch to implement a switch for the RFamp1 and RFamp2 signals. In an exemplary design, the current steering switch may be biased such that approximately equal amounts of current are steered towards the RFamp1 and RFamp2 outputs such that these outputs have approximately equal gain. In another exemplary design, the current steering switch may be biased such that unequal amounts of current are steered towards the RFamp1 and RFamp2 outputs such that these outputs have different gains.

FIGS. 6A to 7C show some exemplary designs of a SIMO LNA having a single input and multiple outputs. A SIMO LNA may also be implemented in other manners. For example, a SIMO LNA may be comprise LNA 730a in FIG. 7A, LNA 730b in FIG. 7B, or LNA 730c in FIG. 7C and may further include a feedback circuit coupled between the input and output of the LNA. The feedback circuit may include a capacitor, a resistor, and/or other circuits coupled in series. The feedback circuit may improve the linearity of the LNA, improve input matching for the LNA, and/or provide other advantages.

Gain control circuits 550 within receive circuits 540 in FIGS. 5A and 5B may be implemented in various manners. Gain control circuits 550 should be able to provide a variable gain that can be accurately selected/controlled. Gain control circuits 550 should also have as little impact to other circuits as possible even when the variable gain is changed.

Figure 8A:
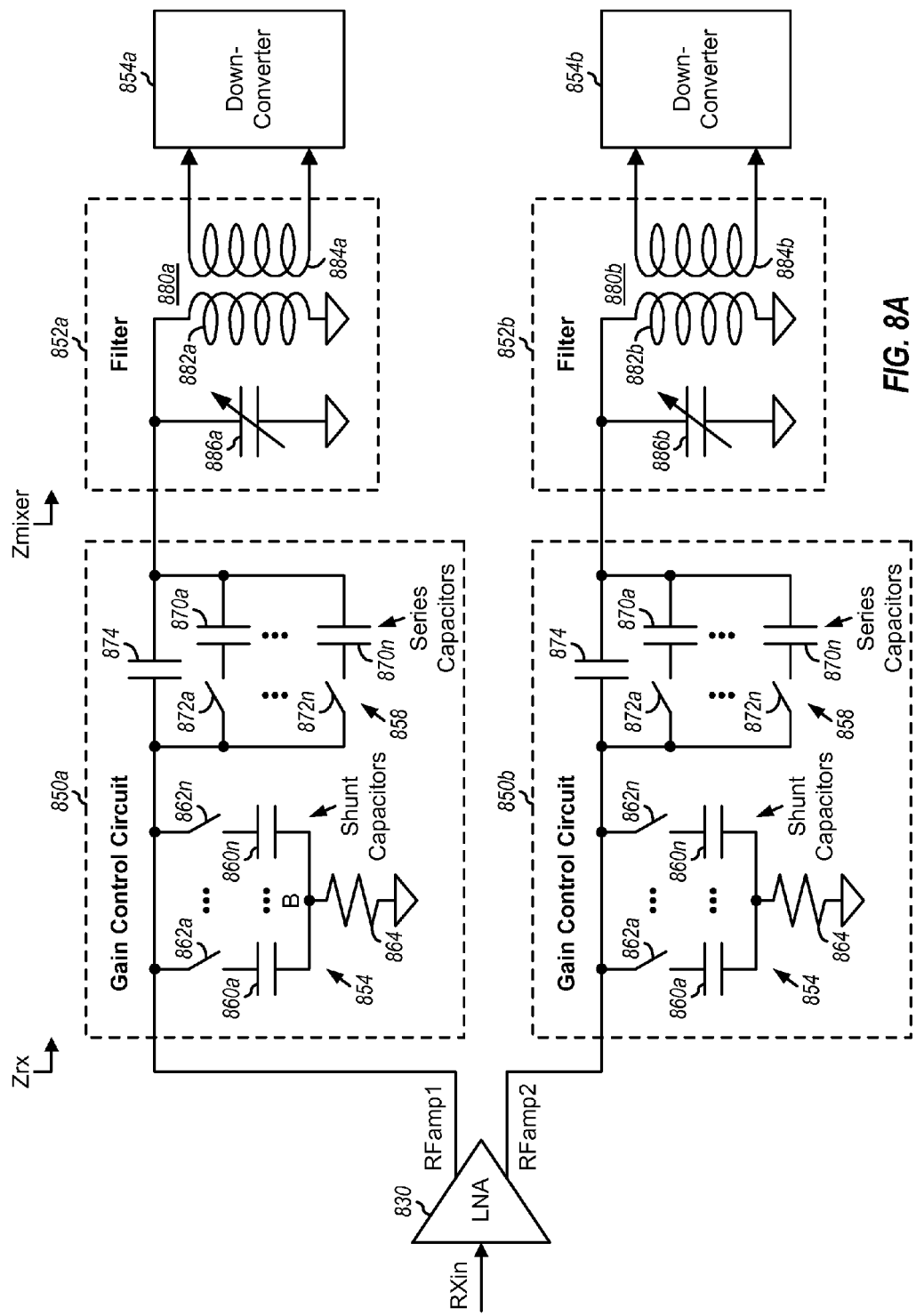
FIGS. 8A and 8B show two exemplary designs of a gain control circuit.

FIG. 8A shows a schematic diagram of an exemplary design of gain control circuits 850a and 850b, which may be used for gain control circuits 550a and 550b in FIGS. 5A and 5B. In the exemplary design shown in FIG. 8A, gain control circuit 850a includes (i) a shunt section 854 comprising a bank of N shunt capacitors 860a to 860n and (ii) a series section 858 comprising a series capacitor 874 coupled in parallel with a bank of N series capacitors 870a to 870n, where N may be any value of one or greater. A shunt capacitor is a capacitor coupled between a node and circuit ground. A series capacitor is a capacitor coupled between two nodes, e.g., between an input and an output of a circuit. Each shunt capacitor 860 is coupled in series with a switch 862, and the series combination of capacitor 860 and switch 862 is coupled between the input of gain control circuit 850a and node B. A resistor 864 is coupled between node B and circuit ground. Each series capacitor 870 is coupled in series with a switch 872, and the series combination of capacitor 870 and switch 872 is coupled between the input and output of gain control circuit 850a. Gain control circuit 850a may also include fewer, different and/or additional circuit components. For example, series capacitor 874 may be omitted, or resistor 864 may be omitted, etc.

The N shunt capacitors 860a to 860n may be paired with the N series capacitors 870a to 870n, respectively. Furthermore, the i-th shunt capacitor 860 may have a capacitance of $C_i$, and the i-th series capacitor 870 may also have the same capacitance of $C_i$. In one exemplary design, the N shunt capacitors 860a to 860n and the N series capacitors 870a to 870n may be binary weighted, so that the (i+1)-th capacitor has twice the capacitance of the i-th capacitor, or $C_{i+1}=2*C_i$. In another exemplary design, the N shunt capacitors 860a to 860n and the N series capacitors 870a to 870n may have the same unit capacitance of C, or $C_i=C$, where C may be any suitable value. In both exemplary designs, capacitors 860a and 870a may have the lowest capacitance of $C_1$. Each remaining capacitor 860 and 870 may have a capacitance of $C_1$ or higher.

Gain control circuit 850a may receive an amplified signal comprising an input current from an LNA 830. Shunt section 852 may route some or all of the input current to circuit ground in order to reduce the gain of gain control circuit 850a. Conversely, series section 858 may route some or all of the input current to the output of gain control circuit 850a in order to increase the gain of the gain control circuit.

Each shunt capacitor 860 may be turned ON by closing its associated switch 862 or turned OFF by opening its switch 862. Each shunt capacitor 860 that is turned ON passes a portion of the input current to circuit ground. Each series capacitor 870 may also be turned ON by closing its associated switch 872 or turned OFF by opening its switch 872. Each series capacitor 870 that is turned ON passes a portion of the input current to the output of gain control circuit 850a. The i-th shunt capacitor 860 may be paired with the i-th series capacitor 870, and one capacitor in the pair may be turned ON while the other capacitor in the pair may be turned OFF. For example, if capacitor 860a is turned ON, then capacitor 870a is turned OFF, or vice versa.

In gain control circuit 850a, the highest gain may be obtained by (i) turning ON all N series capacitors 870a to 870n by closing switches 872a to 872n and (ii) turning OFF all shunt capacitors 860a to 860n by opening switches 862a to 862n. The gain may be reduced by turning OFF a series capacitor 870 and turning ON a corresponding shunt capacitor 860. The lowest gain may be obtained by (i) turning OFF all series capacitors 870 and (ii) turning ON all shunt capacitors 860.

In general, the gain of gain control circuit 850a may be determined by (i) the total capacitance of all series capacitors 870 that are turned ON (or total series capacitance) and (ii) the total capacitance of all shunt capacitors 860 that are turned ON (or total shunt capacitance). Progressively higher gain may be obtained with progressively higher total series capacitance and progressively lower total shunt capacitance. Conversely, progressively lower gain may be obtained with progressively lower total series capacitance and progressively higher total shunt capacitance.

The gain of gain control circuit 850a may also be adjusted relative to the gain of gain control circuit 850b. This may be achieved by turning OFF all shunt capacitors 860 in each gain control circuit 850. The gain of gain control circuit 850a may then be adjusted relative to the gain of gain control circuit 850b by turning ON or OFF series capacitors 870 in the two gain control circuits 850a and 850b.

As shown in FIG. 8A, filter 852a may have an impedance of Zmixer looking into the input of filter 852a. Resistor 864 may have an impedance of R, which may be designed to match the input impedance of filter 852a. Gain control circuit 850a may have an impedance of Zrx looking into the input of gain control circuit 850a. The input impedance of gain control circuit 850a may be kept approximately constant even when the gain is varied. This approximately-constant input impedance may be achieved by maintaining the same total capacitance of all capacitors that are turned ON. In particular, whenever a given shunt capacitor 860 is turned ON, the corresponding series capacitor 870 is turned OFF, or vice versa, thereby maintaining the same capacitance of all capacitors that are turned ON.

Figure 8B:
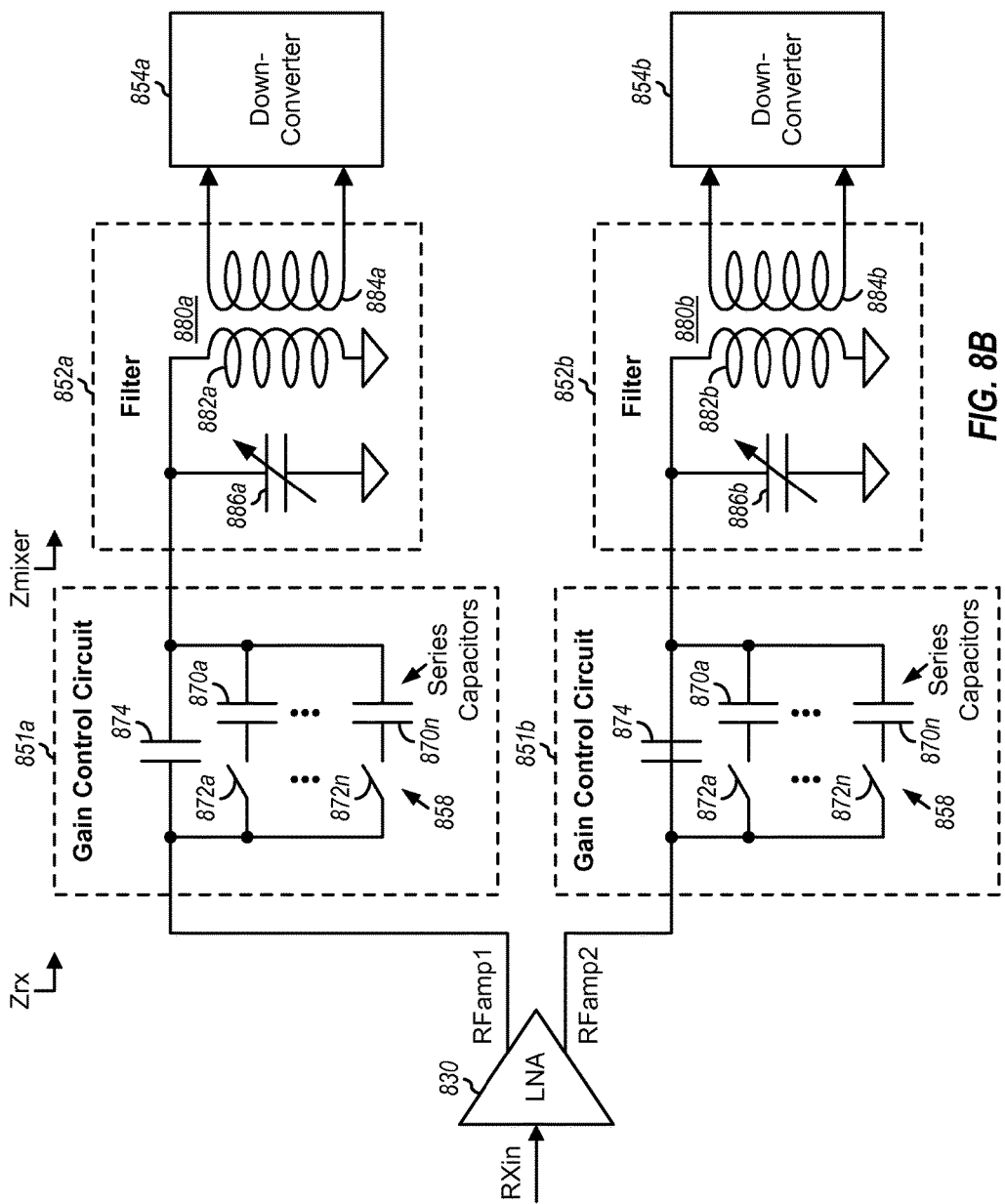

FIG. 8B shows a schematic diagram of an exemplary design of gain control circuits 851a and 851b, which may be used for gain control circuits 550a and 550b in FIGS. 5A and 5B. In the exemplary design shown in FIG. 8B, each gain control circuit 851 includes a series capacitor 874 coupled in parallel with a bank of N capacitors 870a to 870n, where N may be any value of one or greater. Capacitors 870a to 870n are coupled in series with N switches 872a to 872n, respectively. The gain control circuit in FIG. 8B may be operated in a manner such that the gain of one receive path may be increased at the expense of lowering the gain of the other receive path, and vice versa. For example, when all series capacitors 870a to 870n in gain control circuit 851a are switched ON and all series capacitors 870a to 870n in gain control circuit 851b are switched OFF, gain control circuit 851a has the highest gain possible, while gain control circuit 851b has the lowest gain possible. Switching ON capacitor 870i in gain control circuit 851a while switching OFF corresponding capacitor 870i in gain control circuit 851b result in a gain increase of gain control circuit 851a and a gain reduction of gain control circuit 851b, where i=a, b, . . . , n. The impedance looking into gain control circuits 851a and 851b may be maintained approximately constant as long as capacitor 870i in one gain control circuit is switched ON while the corresponding capacitor 870i in the other gain control circuit is switched OFF.

FIGS. 8A and 8B also show an exemplary design of filters 852a and 852b, which may be used for filters 552a and 552b, respectively, in FIGS. 5A and 5B. In the exemplary design shown in FIGS. 8A and 8B, filter 852a includes a transformer 880a and a capacitor 886a. Transformer 880a includes (i) a primary coil 882a coupled between the input of filter 852a and circuit ground and (ii) a secondary coil 884a providing a differential filtered signal to a first downconverter 854a (e.g., downconverter 554a in FIGS. 5A and 5B). Capacitor 886a is coupled between the input of filter 852a and circuit ground. Filter 852b includes a transformer 880b and a capacitor 886b, which are coupled in similar manner as transformer 880a and capacitor 886a in filter 852a.

Filters 852a and 852b may filter the scaled signals from gain control circuits 850a and 850b, respectively. Filters 852a and 852b may also perform single-ended to differential conversion and may provide differential filtered signals to downconverters. In the exemplary design shown in FIGS. 8A and 8B, capacitor 886 in each filter 852 is a variable capacitor that may be adjusted or tuned based on the center frequency of one or more transmitted signals being received via filter 852. For example, capacitor 886a may be adjusted depending on whether the transmitted signal(s) being received is in low-band, mid-band, or high-band. In another exemplary design, capacitor 886a may be a fixed capacitor having a capacitance selected to provide good performance for a desired range of frequencies.

In an exemplary design, an apparatus (e.g., a wireless device, an IC, a circuit module, etc.) may include an LNA and first and second receive circuits. The LNA (e.g., LNA 530 in FIG. 5A) may receive a receiver input signal and provide (i) a first amplified signal for a first set of at least one transmitted signal being received and (ii) a second amplified signal for a second set of at least one transmitted signal being received. The first receive circuit (e.g., receive circuit 540*a* in FIG. 5A) may scale the first amplified signal based on a first adjustable gain selected for the first set of at least one transmitted signal. The second receive circuit (e.g., receive circuit 540*b*) may scale the second amplified signal based on a second adjustable gain selected for the second set of at least one transmitted signal.

The first adjustable gain may be selected independently of the second adjustable gain. In an exemplary design, the first adjustable gain may be selected based on the received power of the first set of at least one transmitted signal, the received power of the second set of at least one transmitted signal, some other parameters, or a combination thereof. The second adjustable gain may be selected based on the received power of the first and/or second set of at least one transmitted signal, some other parameters, or a combination thereof.

In an exemplary design, the first receive circuit may comprise a first gain control circuit (e.g., gain control circuit 550*a* in FIG. 5A) that scales the first amplified signal based on the first adjustable gain. The second receive circuit may comprise a second gain control circuit (e.g., gain control circuit 550*b* in FIG. 5A) that scales the second amplified signal based on the second adjustable gain.

In an exemplary design that is shown in FIG. 8A, the first gain control circuit may comprise a plurality of series capacitors (e.g., capacitors 870*a* to 870*n* in FIG. 8A) coupled in series with a first plurality of switches (e.g., switches 872*a* to 872*n*). The first gain control circuit may further comprise a plurality of shunt capacitors (e.g., capacitors 860*a* to 860*n*) coupled in series with a second plurality of switches (e.g., switches 862*a* to 862*n*). The plurality of series capacitors and the first plurality of switches may be coupled between the input and output of the first gain control circuit. The plurality of shunt capacitors and the second plurality of switches may be coupled between the input of the first gain control circuit and circuit ground. A resistor (e.g., resistor 864) may be coupled in series with the plurality of shunt capacitors and the second plurality of switches. The second gain control circuit may be implemented in similar manner as the first gain control circuit. For each gain control circuit, each of the plurality of shunt capacitors may be paired with one of the plurality of series capacitors. The paired shunt capacitor and series capacitor may have same capacitance. The plurality of shunt capacitors may have different capacitances, which may be determined based on binary weighting or geometric weighting. Alternatively, the plurality of shunt capacitors may have the same capacitance, and the plurality of series capacitors may also have the same capacitance.

In another exemplary design that is shown in FIG. 8B, the plurality of series capacitors and the first plurality of switches may be coupled between the input and output of the first gain control circuit. The second gain control circuit may comprise a second plurality of series capacitors coupled in series with a third plurality of switches.

In an exemplary design, the LNA may comprise first and second transistors. The first transistor (e.g., transistor 644 in FIG. 6A) may have a source coupled to circuit ground, a gate receiving the receiver input signal, and a drain coupled to a node. The second transistor (e.g., transistor 646) may have a source coupled to a power supply, a gate receiving the receiver input signal, and a drain coupled to the node. A resistor (e.g., resistor 648) may be coupled between the node and an input of the LNA.

In another exemplary design, the LNA may comprise an input gain stage and first and second output gain stages. The input gain stage (e.g., input gain stage 632 in FIG. 6B) may receive the receiver input signal and provide an intermediate signal. The first output gain stage (e.g., output gain stage 652*a*) may receive the intermediate signal and provide the first amplified signal. The second output gain stage (e.g., output gain stage 652*b*) may also receive the intermediate signal and provide the second amplified signal. A switch (e.g., switch 650) may be coupled between the outputs of the first and second output gain stages and may be closed to perform noise splitting.

In an exemplary design, the apparatus may further comprise a second LNA and first and second switches. The second LNA (e.g., LNA 530*b* in FIG. 5B) may receive a second receiver input signal. The first switch (e.g., switch 532*a*) may have a first input coupled to a first output of the LNA, a second input coupled to a first output of the second LNA, and an output coupled to the first receive circuit. The second switch (e.g., switch 532*b*) may have a first input coupled to a second output of the LNA, a second input coupled to a second output of the second LNA, and an output coupled to the second receive circuit. The LNA and the second LNA may be used for different bands.

Figure 9:
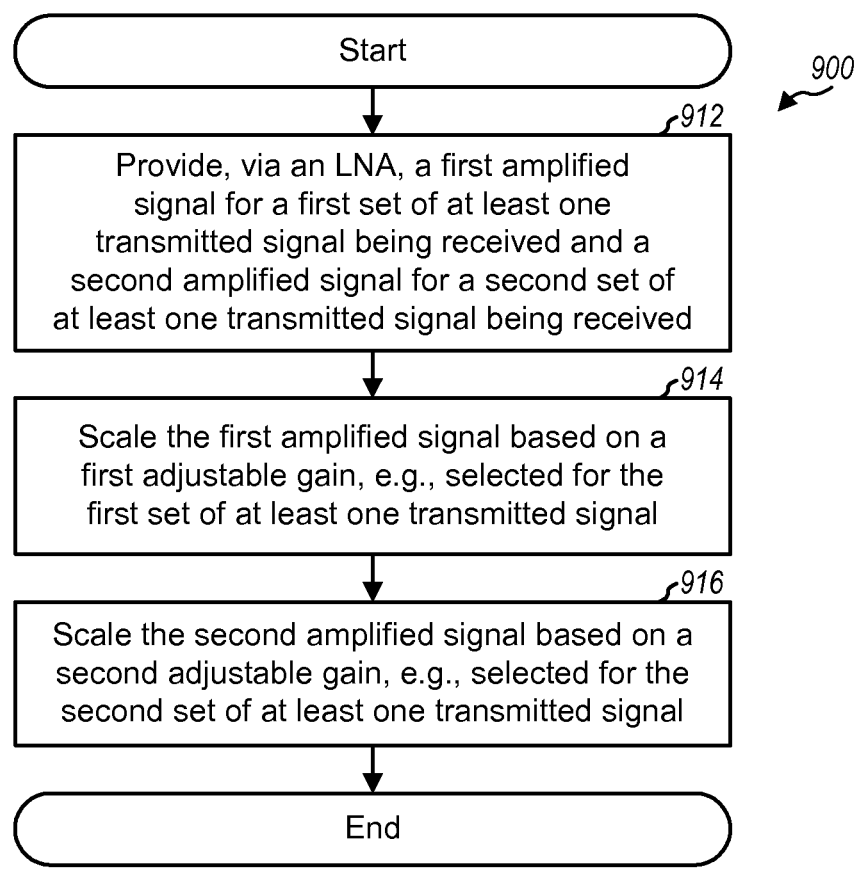
FIG. 9 shows a process for simultaneously receiving multiple transmitted signals.

FIG. 9 shows an exemplary design of a process 900 for simultaneously receiving multiple transmitted signals. A first amplified signal for a first set of at least one transmitted signal being received and a second amplified signal for a second set of at least one transmitted signal being received may be provided via an LNA (block 912). The first amplified signal may be scaled based on a first adjustable gain, which may be selected for the first set of at least one transmitted signal (block 914). The second amplified signal may be scaled based on a second adjustable gain, which may be selected for the second set of at least one transmitted signal (block 916).

In one design of block 912, a receiver input signal may be amplified with an input gain stage of the LNA to obtain an intermediate signal. The intermediate signal may be amplified with a first output gain stage of the LNA to obtain the first amplified signal. The intermediate signal may also be amplified with a second output gain stage of the LNA to obtain the second amplified signal.

In one design of block 914, at least one of a plurality of shunt capacitors and at least one of a plurality of series capacitors in a gain control circuit may be selected based on the first adjustable gain. The first amplified signal may be scaled with the gain control circuit based on the at least one selected shunt capacitor and the at least one selected series capacitor.

The LNAs, gain control circuits, and receive circuits described herein may be implemented on an IC, an analog IC, an RFIC, a mixed-signal IC, an ASIC, a printed circuit board (PCB), an electronic device, etc. The LNAs, gain control circuits, and receive circuits may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNAs, gain control circuits, and/or receive circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a low noise amplifier (LNA) configured as a single-input multiple-output LNA to simultaneously provide a first amplified signal on a first output for a first set of at least one transmitted signal being received and a second amplified signal on a second output for a second set of at least one transmitted signal being received, the first and second amplified signals of a radio technology being carrier aggregated signals including one of intraband carrier aggregated signals or inter-band carrier aggregated signals;
   a first receive circuit configured to scale the first amplified signal of the carrier aggregated signals based on a first adjustable gain; and
   a second receive circuit configured to scale the second amplified signal of the carrier aggregated signals based on a second adjustable gain.

2. The apparatus of claim 1, the first adjustable gain being selected for the first set of at least one transmitted signal, and the second adjustable gain being selected for the second set of at least one transmitted signal.

3. The apparatus of claim 1, the first receive circuit comprising a first gain control circuit configured to scale the first amplified signal based on the first adjustable gain, and the second receive circuit comprising a second gain control circuit configured to scale the second amplified signal based on the second adjustable gain.

4. The apparatus of claim 3, the first gain control circuit comprising:
   a plurality of series capacitors coupled in series with a plurality of switches and between an input and an output of the first gain control circuit.

5. The apparatus of claim 4, the first gain control circuit further comprising:
   a plurality of shunt capacitors coupled in series with a second plurality of switches and between the input of the first gain control circuit and circuit ground.

6. The apparatus of claim 5, each of the plurality of shunt capacitors being paired with one of the plurality of series capacitors, the paired shunt capacitor and series capacitor having equal capacitance.

7. The apparatus of claim 4, the plurality of series capacitors having different capacitances determined based on binary weighting or geometric weighting.

8. The apparatus of claim 5, the first gain control circuit further comprising:
   a resistor coupled in series with the plurality of shunt capacitors and the second plurality of switches.

9. The apparatus of claim 4, the second gain control circuit comprising:
   a second plurality of series capacitors coupled in series with a second plurality of switches and between an input and an output of the second gain control circuit, each of the plurality of series capacitors being paired with one of the second plurality of series capacitors, the paired capacitors having equal capacitance.

10. The apparatus of claim 1, the LNA comprising:
    a first transistor having a source coupled to circuit ground, a gate receiving a receiver input signal, and a drain coupled to a node; and
    a second transistor having a source coupled to a power supply, a gate receiving the receiver input signal, and a drain coupled to the node.

11. The apparatus of claim 10, the LNA further comprising:
    a resistor coupled between the node and an input of the LNA.

12. The apparatus of claim 1, the LNA comprising:
    an input gain stage configured to receive a receiver input signal and provide an intermediate signal;
    a first output gain stage coupled to the input gain stage and configured to provide the first amplified signal; and
    a second output gain stage coupled to the input gain stage and configured to provide the second amplified signal.

13. The apparatus of claim 1, further comprising:
    a switch coupled between the first and second outputs of the LNA and being closed when the first and second amplified signals are provided via the first and second outputs, respectively.

14. The apparatus of claim 1, further comprising:
    a second LNA configured to provide at least one amplified signal;
    a first switch comprising a first input coupled to a first output of the LNA, a second input coupled to a first output of the second LNA, and an output coupled to the first receive circuit; and a second switch comprising a first input coupled to a second output of the LNA, a second input coupled to a second output of the second LNA, and an output coupled to the second receive circuit.

15. A method comprising:
simultaneously providing, via a low noise amplifier (LNA) configured as a single-input multiple-output LNA, a first amplified signal on a first output for a first set of at least one transmitted signal being received and a second amplified signal on a second output for a second set of at least one transmitted signal being received, the first and second amplified signals of a radio technology being carrier aggregated signals including one of intra-band carrier aggregated signals or inter-band carrier aggregated signals;
scaling the first amplified signal of the carrier aggregated signals based on a first adjustable gain; and
scaling the second amplified signal of the carrier aggregated signals based on a second adjustable gain.

16. The method of claim 15, the scaling the first amplified signal comprising:
selecting at least one of a plurality of shunt capacitors and at least one of a plurality of series capacitors in a gain control circuit based on the first adjustable gain; and
scaling the first amplified signal based on the at least one selected shunt capacitor and the at least one selected series capacitor.

17. The method of claim 15, the providing comprising:
amplifying a receiver input signal with an input gain stage of the LNA to obtain an intermediate signal;
amplifying the intermediate signal with a first output gain stage of the LNA to obtain the first amplified signal; and
amplifying the intermediate signal with a second output gain stage of the LNA to obtain the second amplified signal.

18. An apparatus comprising:
means for simultaneously providing, via a low noise amplifier (LNA) means configured as a single-input multiple-output LNA means, a first amplified signal on a first output for a first set of at least one transmitted signal being received and a second amplified signal on a second output for a second set of at least one transmitted signal being received, the first and second amplified signals of a radio technology being carrier aggregated signals including one of intra-band carrier aggregated signals or inter-band carrier aggregated signals;
means for scaling the first amplified signal of the carrier aggregated signals based on a first adjustable gain; and
means for scaling the second amplified signal of the carrier aggregated signals based on a second adjustable gain.

19. The apparatus of claim 18, the means for scaling the first amplified signal comprising:
means for selecting at least one of a plurality of shunt capacitors and at least one of a plurality of series capacitors based on the first adjustable gain; and
means for scaling the first amplified signal based on the at least one selected shunt capacitor and the at least one selected series capacitor.

20. The apparatus of claim 18, the means for providing comprising:
means for amplifying a receiver input signal to obtain an intermediate signal;
means for amplifying the intermediate signal to obtain the first amplified signal; and
means for amplifying the intermediate signal to obtain the second amplified signal.

\* \* \* \* \*